United States Patent [19]

Ako et al.

[11] Patent Number: 5,707,704
[45] Date of Patent: Jan. 13, 1998

[54] MASKING FILMS

[75] Inventors: Satoshi Ako, Asaka; Kan Hashizume, Hachioji; Takashi Shimizu, Yono, all of Japan

[73] Assignee: Kimoto Co., Ltd., Japan

[21] Appl. No.: 577,003

[22] Filed: Dec. 26, 1995

[30] Foreign Application Priority Data

Dec. 27, 1994 [JP] Japan ................ 6-340384

[51] Int. Cl.$^6$ ................ B32B 27/00
[52] U.S. Cl. ................ 428/40.1; 428/40.8; 428/480; 428/522
[58] Field of Search ................ 428/40.1, 354, 428/352, 40.8, 41.6, 480, 521, 522

[56] References Cited

U.S. PATENT DOCUMENTS

| | | | |
|---|---|---|---|
| 2,576,491 | 11/1951 | Ulano | 101/128.2 |
| 3,892,900 | 7/1975 | Shima et al. | 428/40.8 |
| 4,681,784 | 7/1987 | Ebara et al. | 428/40 |
| 4,923,727 | 5/1990 | Maruyama et al. | 428/40.8 |
| 4,925,713 | 5/1990 | Kiryu et al. | 428/41.6 |
| 5,009,944 | 4/1991 | Maruyama et al. | 428/41.6 |
| 5,043,198 | 8/1991 | Maruyama et al. | 428/40.8 |
| 5,085,908 | 2/1992 | Sano et al. | 428/40.8 |
| 5,151,336 | 9/1992 | Yokosuka | 430/7 |
| 5,368,962 | 11/1994 | Kiryu et al. | 428/41.6 X |

OTHER PUBLICATIONS

Jap. Pat. Public. 58-46,011; Oct. 1983 (Abst).
Jap. Pat. Applic. Laid Open 61-166,549 Jul. 1986 (Abst).
Jap. Pat. Applic. Laid Open 2-188,755 Jul. 1990 (Abst.).

*Primary Examiner*—Daniel Zirker
*Attorney, Agent, or Firm*—Lorusso & Loud

[57] ABSTRACT

A masking film comprising a light-shielding peelable layer provided on a transparent support wherein a binder component of the light-shielding peelable layer comprises 20 to 40% by weight of a rubberlike resin, 25 to 75% by weight of a vinyl chloride resin and 5 to 35% by weight of a thermoplastic resin containing OH groups compatible with the rubberlike resin and the vinyl chloride resin based on total resin components, which maintains anti-blocking property and appropriate adhesion after a long period of time.

13 Claims, No Drawings

MASKING FILMS

BACKGROUND OF THE INVENTION

The present invention relates to a masking film mainly used for photomechanical process, wherein desired patterns are cut out from the film and unwanted portions are removed by peeling off to form transparent images of the desired patterns.

As masking films used in the field of photomechanical process, those having a peelable layer laminated on a transparent support composed of a plastic film both with and without an adhesive layer are generally known.

As a binder contained in the light-shielding peelable layer for those masking films comprising an adhesive layer, there have been known those composed of nitrocellulose and plasticizer (U.S. Pat. No. 2,576,491), those composed of nitrocellulose, nitrile rubber and adhesive modifier (Japanese Patent Application Laid Open [KOKAI] No. 61-166549), those composed of nitrocellulose and ethylene/vinyl acetate copolymer (Japanese Patent Application Laid Open [KOKAI] No. 2-188755) and the like.

As a binder contained in the light-shielding peelable layer for those masking films not comprising an adhesive layer, there have been known those composed of nitrile rubber and vinyl chloride/vinyl acetate copolymer (Japanese Patent Publication [KOKOKU] No. 58-46011) and the like.

To obtain the various properties generally required for masking films such as peelability, physical properties of coatings, anti-blocking property, anti-bleeding property and stability of these properties with time, if masking films comprise an adhesive layer, it is relatively easy to select a resin composition of the light-shielding peelable layer to meet the demands because required functions may be shared by the adhesive layer and the light-shielding peelable layer. On the other hand, if masking films do not comprise an adhesive layer, it is difficult to completely satisfy all of the required properties by one layer and hence various problems such as those relating to the balance of anti-blocking property and adhesive property have been observed.

Binder components of the light-shielding peelable layer of masking films are usually composed of a plurality of components because the required various properties cannot be satisfied by a single component. For example, the binders are constituted by balanced mixtures of those components adhesive or making adhesive to the support and those components not adhesive (non-adhesive) to the support.

Those components adhesive or making adhesive to supports herein generally mean those materials imparting plasticity to coatings. As typical examples of such materials, there can be mentioned dibutyl phthalate, dioctyl phthalate, castor oil and the like as those of a low molecular weight and rubberlike elastomers such as nitrile rubbers, acryl rubbers, urethane rubbers, polyesters and the like as those of a high molecular weight.

Typical examples of the materials not adhesive to supports are vinyl chloride resins such as vinyl chloride/vinyl acetate copolymers and vinyl chloride/vinyl acetate/maleic acid copolymers, cellulose resins such as nitrocellulose and the like.

The adhesive materials mentioned above act to impart plasticity and have a low glass transition point in themselves. Therefore, when they are contained in a compatibly mixed system, they may lower the glass transition point of the whole system.

On the other hand, most of the non-adhesive materials show a high hardness and have a higher glass transition temperature compared with the adhesive materials. In conventional masking films, adhesion to supports and antiblocking property have been controlled by mixing components selected from those of the two types mentioned above with a good balance.

However, if the adhesive materials are added in such a large amount that sufficient adhesion could be obtained so as to prevent removal or peeling of the light-shielding peelable layer, the glass transition point of the whole light-shielding peelable layer is lowered as described above. As a result, coated peelable layers may be softened under high temperature circumstances in summer season, for example, during storage at warehouses or on shelves and in film dispensers and they may cause a problem of blocking. Further, problems of film elongation may also be caused due to their plasticity under such high temperature circumstances.

On the other hand, if a large amount of the non-adhesive materials are added to elevate the glass transition point, though anti-blocking property may be improved, adhesion is deteriorated and problems of removal and peeling of coated layers may be caused. Further, coated layers become hard and brittle and hence become likely to break.

To improve the anti-blocking property, organic or inorganic fillers may be added to the light-shielding peelable layer. However, when instability as to physical property change with time of the coated layers, wear-out of cutting edges, transparency of the coated layers and the like are considered, content of such fillers must be restricted to a few percent of the binder component and such a content cannot be considered sufficient to improve anti-blocking property and the other properties simultaneously.

In addition to the problems of anti-blocking property and adhesion described above, conventional light-shielding masking films also have a problem that physical properties of the coated layers are changed with time.

That is, if conventional binder components are used, even though masking films of this type are produced with a composition of the plastic adhesive materials and the hard non-adhesive materials mentioned above which is considered appropriate, coated layers may get harder within a certain period passed during their distribution and the like after their production and before their use.

Moreover, since the binder components usually contain additives, for example, light-shielding materials such as dyes, pigments, alumina and zinc oxide, organic and inorganic fillers and the like, they become more likely to suffer from change of their physical properties with time.

Therefore, the object of the present invention is to provide masking films which can simultaneously solve the above-described various problems not solved hitherto, namely, the problem of the contradictory properties, anti-blocking property and appropriate adhesion and the problem of instability of coating properties relating to their change with time.

DESCRIPTION OF THE INVENTION

The present invention provides a masking film comprising a light-shielding peelable layer provided on a transparent support wherein a binder component of the light-shielding peelable layer comprises at least a rubberlike resin, a vinyl chloride resin, and a thermoplastic resin containing OH (hydroxyl) groups and being compatible with the rubberlike resin and the vinyl chloride resin. The binder component comprises 20 to 40% by weight of the rubberlike resin, 25 to 75% by weight of the vinyl chloride resin and 5 to 35% by weight of the thermoplastic resin containing OH groups compatible with them based on the total resin components.

The masking film of the present invention will be explained more specifically hereinafter.

The transparent support may be plastic films composed of polyesters, polycarbonates, triacetylcelluloses, polyvinyl chlorides, acrylic resins, polystyrenes, polyamides, polyimides, polyethylenes, polypropylenes and the like and biaxially oriented polyester films are preferred in terms of transparency. Those films having a thickness of 25 to 250 μm may be suitably used.

The light-shielding peelable layer comprises the specific binder components mentioned above and light-shielding materials for shielding active rays. The specific binder components comprise 20 to 40% by weight, preferably 25 to 35% by weight of the rubberlike resin, 25 to 75% by weight, preferably 35 to 65% by weight of the vinyl chloride resin and 5 to 35% by weight, preferably 5 to 30% by weight of the thermoplastic resin containing OH groups compatible with the rubberlike resin and the vinyl chloride resin.

The rubberlike resin is adhesive to the transparent support and functions to impart plasticity to coated layers. Examples of the rubberlike resin are nitrile rubbers, acrylic rubbers, urethane rubbers, butadiene rubbers, isoprene rubbers, styrene/butadiene rubbers, carboxyl group-containing nitrile rubbers, butyl rubbers, ethylene/vinyl acetate rubbers, ethylene/acrylic resin rubbers, chlorinated polyethylenes, chlorosulfonated polyethylenes and other various thermoplastic elastomers. Among these, nitrile rubbers are particularly preferred in terms of adhesion and compatibility.

The rubberlike resin may have a molecular weight of from 5,000 to 2,000,000, preferably from 10,000 to 1,500,000.

The term "vinyl chloride resin" herein means a polymer containing units derived from vinyl chloride monomers. As the vinyl chloride resin, used are those showing compatibility with the rubberlike resin described above and not being sticky at room temperature. Most of such vinyl chloride resins show good film-forming property, form relatively hard coatings and are compatible with the rubberlike resin though they do not show sufficient adhesion to the support. They impart flame-resistance and strength to coated layers and function to control adhesion and flexibility of coated layers. Examples of the vinyl chloride resin are vinyl chloride/vinyl acetate copolymers, vinyl chloride/acrylic acid copolymers, vinyl chloride/acrylic ester copolymers, vinyl chloride/vinylidene chloride copolymers, chlorinated vinyl chloride resins and the like.

The vinyl chloride resin may have a molecular weight of from 2,000 to 200,000, preferably from 4,000 to 100,000.

By controlling the mixing ratio of the two kinds of the components mentioned above, adhesion to the support and flexibility as well as glass transition point of coated layers may be controlled. However, optimum adhesion, flexibility and glass transition point cannot be simultaneously obtained by these two components as described above. That is, in order to obtain good adhesion and flexibility, a relatively large amount of the rubberlike resin should be added, whereby glass transition point of coatings is lowered and this causes blocking under high temperature circumstances in summer.

Therefore, according to the present invention, an appropriate amount of the thermoplastic resin containing OH groups is added in addition to the two kinds of components to make possible to simultaneously obtain optimum anti-blocking property, adhesion and flexibility. In the two-component system of the rubberlike resin and the vinyl chloride resin, by substituting a part of the vinyl chloride resin with the thermoplastic resin containing OH groups, anti-blocking property and adhesion to the support of the resulting three-component system are remarkably improved even though the calculated glass transition point of the whole three-component binder is lower than that of the whole two-component binder.

Though it is not fully understood why such results can be obtained, it is considered that the OH groups introduced by adding a certain amount of the thermoplastic resin containing OH groups form pseudo bindings with polar moieties of the other resins by intermolecular force, thereby suppressing thermal mobility of the molecules to elevate apparent glass transition point or softening point and thus improving anti-blocking property. However, when the amount of the resin containing OH groups exceeds a certain level, amount of the resins other than the resin containing OH groups is decreased and thus the pseudo bindings are not formed. This would make it impossible to suppress the thermal motion of the molecules and hence make it impossible to improve anti-blocking property.

As to the improvement of adhesion by introducing OH groups, it may be considered that OH groups, which are adhesive factors, improve adhesion.

With respect to stability as to change with time of physical properties of coated layers, usual low molecular weight plasticizers, though they show plasticizing effect over the whole coatings when the coated layers are formed, gradually lost that effect due to vaporization proceeding with time and ununiformity caused by bleeding. However, it is considered that, if a resin can be mixed compatibly to show plasticizing effect, uniformity can be maintained even after time lapse and thus stability of the properties can be obtained.

The thermoplastic resin containing OH groups may have a molecular weight of from 2,000 to 200,000, preferably from 4,000 to 100,000.

Examples of the resin containing OH groups are phenoxy resins, epoxy resins, acrylic resins, polyvinyl acetals, vinyl chloride/acrylic ester copolymers, vinyl chloride/vinyl acetate/vinyl alcohol copolymers, styrene/maleic acid half esters, cellulose resins and the like.

According to the present invention, the problems of anti-blocking property and the like may be solved by using the three kinds of components mentioned above in amounts of 20 to 40% by weight for the rubberlike resin, 25 to 75% by weight for the vinyl chloride resin and 5 to 35% by weight for the thermoplastic resin containing OH groups.

The content of the rubberlike resin of 20% by weight or more based on the total resin makes it possible to impart adhesion to the support and flexibility of coated layers and the same of 40% by weight or less can prevent excessive adhesion and flexibility, whereby it is possible to prevent elongation of films when they are peeled off.

The content of the vinyl chloride resin of 25% by weight or more based on the total resin makes it possible to impart appropriate peeling property, flexibility and strength to coated layers and the same of 75% by weight or less can prevent the coated layers from becoming too easy to peel or too hard.

The content of the thermoplastic resin containing OH groups of 5% by weight or more based on the total resin makes it possible to impart anti-blocking property, adhesion and stability as to physical property change with time to coated layers and the same of 35% by weight or less can prevent excessively strong adhesion, i.e., prevent coated layers of large area from becoming difficult to peel, and prevent break of coated layers upon peeling and fracture of supports due to cohesion. In this case, the thermoplastic resin containing OH groups preferably contains 0.5 to 15% by weight of OH groups based on the weight of the thermoplastic resin itself When the glass transition point of the thermoplastic resin containing OH groups is lower than that of the vinyl chloride resin, the glass transition point of the whole coated layer should be lowered. However, by the addition of the thermoplastic resin containing OH groups, anti-blocking property is remarkably improved.

According to the present invention, by utilizing this phenomenon, stability as to physical property change with time can be obtained with a composition optimum for adhesion and flexibility without sacrificing anti-blocking property. This could never be realized by the conventional two-component systems.

In addition to the resin components explained hereinbefore, the light-shielding peelable layer contains light-shielding dyes or pigments, and it may optionally contain other additives such as organic and inorganic matting agents, leveling agents, anti-static agents and moisture controlling agents. The light-shielding peelable layer has a thickness of from 10 to 50 µm, preferably from 15 to 45 µm.

The masking films of the present invention can be produced by preparing a coating solution comprising the resin components described above dissolved or dispersed in a ketone or aromatic solvent and coating the solution on a transparent support by a conventional coating method such as kiss-roll coating, bar coating, knife coating, gravure coating and microgravure coating.

The masking films of the present invention having the characteristics described above show improved anti-blocking property, adhesion to supports and stability as to change of physical properties of coatings with time.

EXAMPLES

The present invention will be further explained by referring to the following non-limitative examples.

Coating solutions for light-shielding peelable layer having a composition shown in Table 1 were each coated on a polyester film having a thickness of 100 µm by a Mayer bar, dried for 6 minutes at 120° C. to give masking films having a film thickness of 23 µm (Examples 1 to 4 and Comparative Examples 1 to 5).

TABLE 1

| Component | Example (part by weight) | | | | Comparative Example (part by weight) | | | | |
|---|---|---|---|---|---|---|---|---|---|
| | 1 | 2 | 3 | 4 | 1 | 2 | 3 | 4 | 5 |
| Nitrile rubber (NIPPOL 1052J, Nippon Zeon) | 3.0 | 3.0 | 3.0 | | 3.0 | 3.0 | 1.6 | 4.5 | |
| Acrylic rubber (NIPPOL AR31, Nippon Zeon) | | | | 3.5 | | | | | 3.5 |
| Vinyl chloride/vinyl acetate copolymer (DENKA #1000MT, Denki Kagaku) | 6.5 | 5.5 | 4.5 | | 7.0 | 3.0 | 5.9 | 3.0 | |
| Vinyl chloride/vinyl acetate copolymer (VINYLITE VYHH, Union Carbide) | | | | 5.0 | | | | | 6.5 |
| Vinyl chloride/vinyl acetate/ vinyl alcohol copolymer (MPR-TAO, Nissin Chemical Industry) | 0.5 | 1.5 | 2.5 | 1.5 | | 4.0 | 2.5 | 2.5 | |
| Orange dye | 0.7 | 0.7 | 0.7 | 0.7 | 0.7 | 0.7 | 0.7 | 0.7 | 0.7 |
| Silica (OK-412, DeGussa) | 0.2 | 0.2 | 0.2 | 0.2 | 0.2 | 0.2 | 0.2 | 0.2 | 0.2 |
| Additive (Fluorad FC-431, Sumitomo 3M) | 0.1 | 0.1 | 0.1 | 0.1 | 0.1 | 0.1 | 0.1 | 0.1 | 0.1 |
| Methyl ethyl ketone | 44.5 | 44.5 | 44.5 | 44.5 | 44.5 | 44.5 | 44.5 | 44.5 | 44.5 |
| Toluene | 44.5 | 44.5 | 44.5 | 44.5 | 44.5 | 44.5 | 44.5 | 44.5 | 44.5 |
| Total | 100.0 | 100.0 | 100.0 | 100.0 | 100.0 | 100.0 | 100.0 | 100.0 | 100.0 |

The masking films of Examples 1 to 4 and Comparative Examples 1 to 5 were stored in an atmosphere of 65% RH at 20° C. for a week and evaluated with respect to the properties shown in Table 2. Results are also shown in Table 2.

TABLE 2

| | Example (part by weight) | | | | Comparative Example (part by weight) | | | | |
|---|---|---|---|---|---|---|---|---|---|
| | 1 | 2 | 3 | 4 | 1 | 2 | 3 | 4 | 5 |
| Film thickness (µm) | 23 | 23 | 23 | 23 | 23 | 23 | 23 | 23 | 23 |
| Yield stress (g/15 mm) | 1000 | 950 | 900 | 900 | 1000 | 800 | 1500 | — | 900 |
| Breaking force (g/15 mm) | 1350 | 1350 | 1300 | 1300 | 1350 | 1250 | 1000 | — | 1300 |
| Elongation of coating (%) | 300 | 290 | 290 | 250 | 300 | 270 | 100 | — | 250 |
| Peel strength (g/25 mm) | 300 | 400 | 400 | 350 | 200 | * | 100 | — | 300 |
| Anti-blocking property | 3 | 4 | 5 | 4 | 2 | 5 | 5 | 1 | 1 |

TABLE 2-continued

| | Example (part by weight) | | | | Comparative Example (part by weight) | | | | |
|---|---|---|---|---|---|---|---|---|---|
| | 1 | 2 | 3 | 4 | 1 | 2 | 3 | 4 | 5 |
| Total Evaluation | ○ | ○ | ○ | ○ | x | x | x | x | x |

The symbol — indicates that the coating could not be peeled.
The symbol * indicates that the coating was broken and could not be peeled.

Anti-blocking property was evaluated in accordance with the criteria shown in Table 3 by sampling immediately after the coating and the drying, accelerating blocking under a pressure of 50 g/cm² in an atmosphere of 10% RH at 50° C. for 24 hours and thereafter measuring blocking area.

TABLE 3

| Evaluation grade | Proportion of blocking area |
|---|---|
| 5 | 0% |
| 4 | More than 0% to 2% |
| 3 | More than 2% to 5% |
| 2 | More than 5% to 10% |
| 1 | More than 10% |

It had been confirmed, from relation between blocking observed for product or semi-product rolls stored in warehouses and that observed in the blocking acceleration test described above, that films showing 5% or less of blocking area in the blocking acceleration test generally show no practical problems. More preferably, films show 2% or less of blocking area.

Measurements were performed on samples of coated layer measured 100 mm×15 mm for yield stress, breaking force and elongation of coated layer, and on samples of coated layer measured 200 mm×25 mm for peel strength.

The films of Examples 1 to 4 showed little change of physical properties with time, i.e., they maintained stable yield stress (hardness of coated layer), elongation of coated layer and peel strength and showed good values of anti-blocking property even after one year storage under an atmosphere of 65% RH at 20° C. On the other hand, the films of Comparative Examples 1 to 5 could not show satisfactory hardness of coated layer, elongation, peeling property and anti-blocking property simultaneously.

As explained above, the light-shielding masking films of the present invention maintained anti-blocking property and appropriate adhesion after a long period of time. Therefore, they do not cause blocking during their transportation and storage, they can be stored without paying much attention to their storage condition and they do not require interleaves.

In addition, they show good stability as to change of physical properties even after lapse of time and they are excellent masking films permanently showing the same cutting property and peeling property at any stage where they are used, for example, immediately after their production and during their storage.

What is claimed is:

1. A masking film having long-life adhesiveness and a good anti-blocking property, said masking film comprising a light-shielding peelable layer provided on a transparent support wherein said peelable layer includes a binder component which comprises:

20 to 40% by weight of a rubber-like resin,
25 to 75% by weight of a vinyl chloride resin and
5 to 35% by weight of a thermoplastic resin containing OH groups compatible with the rubberlike resin and the vinyl chloride resin, based on total resin components,
said thermoplastic resin containing OH groups being selected from the group consisting of phenoxy resins, epoxy resins, polyvinyl acetals, vinyl chloride/vinyl acetate/vinyl alcohol terpolymers and styrene/maleic acid half esters.

2. The masking film of claim 1 wherein said binder component of the light-shielding peelable layer comprises 25 to 35% by weight of said rubberlike resin, 35 to 65% by weight of said vinyl chloride resin and 5 to 30% by weight of said thermoplastic resin containing OR groups compatible with the rubberlike resin and the vinyl chloride resin, based on total resin components.

3. The masking film of claim 1 wherein the rubberlike resin is selected from the group consisting of nitrile rubbers, acrylic rubbers, urethane rubbers, butadiene rubbers, isoprene rubbers, styrene/butadiene rubbers, carboxyl group-containing nitrile rubbers, butyl rubbers, ethylene/vinyl acetate rubbers, ethylene/acrylic resin rubbers, chlorinated polyethylenes and chlorosulfonated polyethylenes.

4. The masking film of claim 3 wherein the rubberlike resin is selected from the group consisting of nitrile rubbers.

5. The masking film of claim 1 wherein the vinyl chloride resin is selected from the group consisting of vinyl chloride/vinyl acetate copolymers, vinyl chloride/acrylic acid copolymers, vinyl chloride/acrylic ester copolymers, vinyl chloride/vinylidene chloride copolymers and chlorinated vinyl chloride resins.

6. The masking film of claim 1 wherein the thermoplastic resin containing OH groups is selected from the group consisting of phenoxy resins, epoxy resins, acrylic resins, polyvinyl acetals, vinyl chloride/acrylic ester copolymers, vinyl chloride/vinyl acetate/vinyl alcohol copolymers, styrene/maleic acid half esters and cellulose resins.

7. The masking film of claim 1 wherein the light-shielding peelable layer has a thickness of from 10 to 50 μm.

8. The masking film of claim 7 wherein the light-shielding peelable layer has a thickness of from 15 to 45 μm.

9. The masking film of claim 1 wherein the transparent support is a plastic film composed of a material selected from the group consisting of polyesters, polycarbonates, triacetylcelluloses, polyvinyl chlorides, acrylic resins, polystyrenes, polyamides, polyimides, polyethylenes and polypropylenes.

10. The masking film of claim 9 wherein the transparent support is a biaxially oriented polyester film.

11. The masking film of claim 1 wherein the transparent support has a thickness of from 25 to 250 μm.

12. A masking film having long-life adhesiveness and a good anti-blocking property, said masking film comprising a light-shielding peelable layer provided on a transparent support wherein said peelable layer includes a binder component which comprises 20 to 40% by weight of a rubber-like resin, 25 to 75% by weight of a vinyl chloride resin and 5 to 35% by weight of a vinyl chloride/vinyl acetate/vinyl alcohol terpolymer compatible with the rubberlike resin and vinyl chloride resin, based on total resin components.

13. The masking film of claim 12 wherein the rubberlike resin is selected from the group consisting of nitrile rubbers, acrylic rubbers, urethane rubbers, butadiene rubbers, isoprene rubbers, styrene/butadiene rubbers, carboxyl group-containing nitrile rubbers, butyl rubbers, ethylene/vinyl acetate rubbers, ethylene/acrylic resin rubbres, chlorinated polyethylenes and chlorosulfonated polyethylenes and wherein said vinyl chloride resin is a vinyl chloride/vinyl acetate copolymer.

* * * * *

UNITED STATES PATENT AND TRADEMARK OFFICE
CERTIFICATE OF CORRECTION

PATENT NO. : 5,707,704
DATED : January 13, 1998
INVENTOR(S) : AKO et al

It is certified that error appears in the above-indentified patent and that said Letters Patent is hereby corrected as shown below:

Col. 8, line 24, "OR" should read --OH--.

Signed and Sealed this

Tenth Day of November 1998

Attest:

BRUCE LEHMAN

Attesting Officer      Commissioner of Patents and Trademarks